United States Patent
Kanitz et al.

(10) Patent No.: US 10,340,465 B2
(45) Date of Patent: Jul. 2, 2019

(54) PEROVSKITE PARTICLES FOR PRODUCING X-RAY DETECTORS BY MEANS OF DEPOSITION FROM THE DRY PHASE

(71) Applicant: Siemens Healthcare GmbH, Erlangen (DE)

(72) Inventors: Andreas Kanitz, Hoechstadt (DE); Oliver Schmidt, Erlangen (DE); Sandro Francesco Tedde, Weisendorf (DE)

(73) Assignee: SIEMENS HEALTHCARE GMBH, Erlangen (DE)

( * ) Notice: Subject to any disclaimer, the term of this patent is extended or adjusted under 35 U.S.C. 154(b) by 0 days.

(21) Appl. No.: 15/362,847

(22) Filed: Nov. 29, 2016

(65) Prior Publication Data
US 2017/0170412 A1    Jun. 15, 2017

(30) Foreign Application Priority Data
Dec. 14, 2015  (DE) .................. 10 2015 225 145

(51) Int. Cl.
*H01L 51/00* (2006.01)
*H01L 51/42* (2006.01)
(Continued)

(52) U.S. Cl.
CPC ............ *H01L 51/0077* (2013.01); *G01T 1/20* (2013.01); *H01L 27/308* (2013.01);
(Continued)

(58) Field of Classification Search
CPC .............. H01L 51/0077; H01L 51/424; H01L 51/0026; H01L 27/308; G01T 1/20; Y02E 10/549
See application file for complete search history.

(56) References Cited

U.S. PATENT DOCUMENTS

2003/0148881 A1\* 8/2003 Matsuo .................. B01J 21/063
                                                502/304
2016/0268528 A1\* 9/2016 Watson ................. H01L 51/422
(Continued)

FOREIGN PATENT DOCUMENTS

DE     102013226339 A1    6/2015
DE     102014212424 A1    6/2015
(Continued)

OTHER PUBLICATIONS

Liu, Mingzhen et al.: "Efficient planar heterojunction perovskite solar cells by vapour deposition", in: Nature, 2013, vol. 501, pp. 395-398, DOI:10.1038/nature12509.
(Continued)

*Primary Examiner* — Thanh Y Tran
(74) *Attorney, Agent, or Firm* — Harness, Dickey & Pierce, P.L.C.

(57) ABSTRACT

An embodiment relates to a composition including at least two powders. The powders are selected from the group including a powder including a p-doped perovskite; a powder including an n-doped perovskite; and a powder including an undoped perovskite. A method for producing the composition, a method for producing a detector using the composition, and a detector, in particular an X-ray detector, produced thereby are also disclosed.

23 Claims, 6 Drawing Sheets

(51) Int. Cl.
*H01L 27/30* (2006.01)
*G01T 1/20* (2006.01)

(52) U.S. Cl.
CPC ........ *H01L 51/0026* (2013.01); *H01L 51/424* (2013.01); *Y02E 10/549* (2013.01)

(56) References Cited

U.S. PATENT DOCUMENTS

| | | |
|---|---|---|
| 2016/0320494 A1 | 11/2016 | Hartmann et al. |
| 2017/0168166 A1 | 6/2017 | Fischer et al. |
| 2017/0213651 A1* | 7/2017 | Wang .................. H01G 9/2018 |

FOREIGN PATENT DOCUMENTS

| | | |
|---|---|---|
| DE | 102014203685 A1 | 9/2015 |
| DE | 102014225541 A1 | 6/2016 |
| DE | 102014225543 A1 | 6/2016 |
| EP | 2942826 A2 | 11/2015 |
| WO | WO2015091145 | 6/2015 |
| WO | WO 20150091178 A1 | 6/2015 |
| WO | WO 20160091442 A1 | 6/2016 |
| WO | WO 20160091600 A1 | 6/2016 |

OTHER PUBLICATIONS

Zhou, Huanping et al.: "Interface engineering of highly efficient perovskite solar cells", in: Science, vol. 345, Aug. 1, 2014, pp. 542-546; DOI:10.1126/science.1254050.

Giorgi, Giacomo et al.: "Small Photocarrier Effective Masses Featuring Ambipolar Transport in Methylammonium Lead Iodide Perovskite: A Density Functional Analysis", in: J. Phys. Cem. Lett., 2013, vol. 4, pp. 4213-4216, dx.doi.org/10.1021/jz4023865.

Wang K. et al.: "Bulk heterojunction perovskite hybrid solar cells with large fill factor"; In Engergy & Environmental Science; 8; pp. 1245-1255; ISSN 1754-5692; 2015.

Stranks D. Samuel et al.: "Electron-Hole Diffusion Lengths Exceeding 1 Micrometer in an Organometal Trihalide Perovskite Absorber", in: Science, vol. 342, Oct. 18, 2013; pp. 341-344; DOI:10.1126/science.1243982.

* cited by examiner

PEROVSKITE PARTICLES FOR PRODUCING X-RAY DETECTORS BY MEANS OF DEPOSITION FROM THE DRY PHASE

PRIORITY STATEMENT

The present application hereby claims priority under 35 U.S.C. § 119 to German patent application number DE 102015225145.4 filed Dec. 14, 2015, the entire contents of which are hereby incorporated herein by reference.

FIELD

At least one embodiment of the invention generally relates to a composition comprising at least two powders, wherein the powders are selected from the group consisting of a powder comprising a p-doped perovskite, a powder comprising an n-doped perovskite, and a powder comprising an undoped perovskite. At least one embodiment of the invention further generally relates to a method for producing the composition, a method for producing a detector using the composition, and/or a detector, in particular an X-ray detector, produced thereby.

BACKGROUND

Currently, digital X-ray images are preferably recorded by way of indirect converters including e.g. a CsI scintillator layer deposited onto an a-Si photodetector matrix. Alternatively, direct converters, such as e.g. a-Se, also find application, primarily in applications that require a high resolution, such as mammography. Detectors based on amorphous silicon (indirect conversion) and amorphous selenium (direct conversion) therefore represent the current background art.

Figure 1:
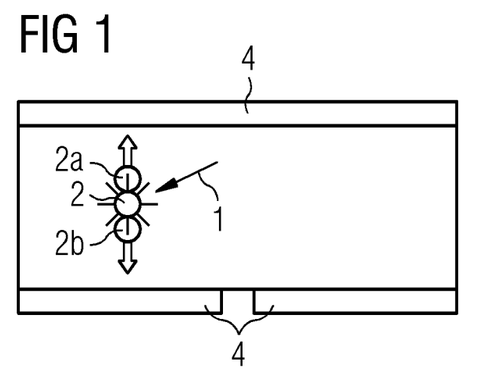
FIGS. 1 and 2 are schematic representations contrasting the concepts of direct X-ray conversion (FIG. 1) and indirect X-ray conversion (FIG. 2).
Figure 2:
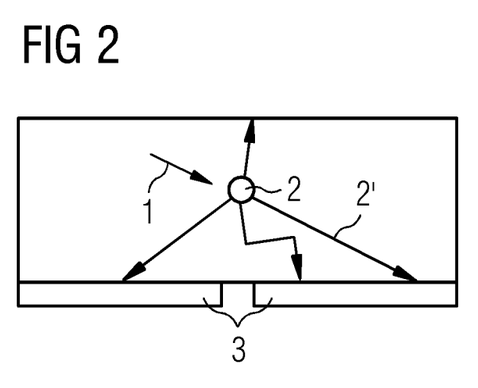

The principles underlying direct conversion and indirect conversion are represented schematically in FIG. 1 and FIG. 2, respectively. In the case of direct conversion, an X-ray quantum 1 is absorbed in the semiconductor 2, during which process electron-hole pairs 2a, 2b are generated which then migrate to the electrodes 4 (anode and cathode respectively, e.g. pixel electrodes) and are detected there. In the case of indirect conversion, the X-ray quantum 1 is absorbed in the scintillator 2, which in turn emits radiation 2' at lower energy (e.g. visible light, UV or IR radiation), which is then detected via a photodetector 3 (e.g. a photodiode).

Indirect X-ray conversion therefore includes for example the combination of a scintillator layer (e.g. $Gd_2O_2S$ or CsI with different doping agents such as terbium, thallium, europium, etc.; layer thicknesses typically 0.1-1 mm) and a photodetector (preferably a photodiode). The emission wavelength of the scintillator light as a result of X-ray conversion in this case overlaps with the spectral sensitivity of the photodetector.

In the case of direct X-ray conversion, the X-ray radiation is for example once again converted directly into electron-hole pairs and these are read out electronically (e.g. amorphous Se). Direct X-ray conversion into selenium is typically performed using layers up to 1 mm thick which are biased in the kV range (electrical fields up to 10 V/μm). Whereas indirectly converting detectors have become established as the norm, in particular because they can be produced easily and cost-effectively, direct converters generally possess a significantly better resolution capacity.

Many applications of organic electronics (e.g. organic light-emitting diode, organic light-emitting electrochemical cell, organic photovoltaics, organic field effect transistor or organic photodetector), such as e.g. detectors, for example X-ray detectors, are currently realized in process engineering terms by way of either physical gas phase or wet-chemical coating or printing methods, wherein said methods can be used for example for building the respective component architectures. In this regard gas phase deposition is used principally for organic small molecules, and wet-chemical processing both for small organic molecules and for polymers.

In this case gas phase deposition generally requires a complex and expensive process engineering solution, whereas wet-chemical depositions usually make the use of solvents, additives and/or dispersants necessary, which can detrimentally affect the components and/or necessitate heightened and cost-intensive safety measures, protective enclosures and personnel training programs on account of the hazardous nature of the substances added.

For many applications there is also a requirement for layers having homogeneous layer thicknesses of several 10 to several 100 μm, such as e.g. absorbing layers in gamma-ray and/or X-ray detectors, during the production of which by way of the above methods material losses and/or material damage may occur or special complex and expensive manufacturing measures are necessary.

In order to fabricate thicker layers, the production of detectors, in particular X-ray detectors, via dry phase deposition is proposed in DE 10 2013 226 339, DE 10 2014 225 543 and DE 10 2014 225 541.

Furthermore, methods are described in DE 10 2013 226 338, DE 10 2014 212 424, DE 10 2013 226 339 and DE 10 2014 203 685 which make provision in a first step for the production of core-shell powders and in a second step for the compression of the powders to form a homogeneous film. Said powders consist of particles that have an envelope composed of organic semiconductor materials.

In addition, the use of perovskites, e.g. lead iodide perovskites, in detector layers is disclosed in DE 10 2014 225 543 and DE 10 2014 225 541.

It is additionally known from the literature that lead iodide perovskites feature an ambipolar transport, with a longer diffusion constant for electrons than for holes, as described in Giorgi et al., Small Photocarrier Effective Masses Featuring Ambipolar Transport in Methylammonium Lead Iodide Perovskite: A Density Functional Analysis, Phys. Chem. Lett., 2013, 4 (24), pp. 4213-4216. With increasing layer thicknesses, the ambipolar transport and the unbalanced diffusion constant of the charge carriers can lead to an increase in recombination losses.

In this case the high electrical conductivity and high charge carrier mobility of the perovskites can have a positive effect in terms of the charge carrier extraction from the absorber layer, which can enable an improvement in efficiency, although conversely this can also lead to leakage currents and, as a result thereof, increased dark currents, which can limit the dynamic range of the X-ray detectors. On the other hand, the dynamic range of an X-ray detector can be increased by reducing the dark currents.

A reduction in dark currents can be achieved for example by a use of intermediate layers, as a result of which p-i-n structures can be formed. The intermediate layers, also called interlayers, can be deposited for example from the liquid phase or from the gas phase. Intermediate layers may consist for example of organic and inorganic conductors or semiconductors or comprise such. An example of such p-i-n structures is disclosed in Liu et al., Efficient planar heterojunction perovskite solar cells by vapor deposition, Nature 2013, Vol. 501, 397. As described there, the efficiency of solar cells is increased via gas phase deposition by comparison with liquid phase deposition. It is conceivable in this case that the diffusion constant of the charge carriers is greater in vapor-deposited perovskites than in liquid-processed ones.

Once a perovskite lattice has been formed, the transport properties of the charge carriers are usually dependent on the material and on the crystallinity of the layer. Thus, for example, the diffusion length of electrons and holes in lead iodide perovskites (CH3NH3PbI3) amounts to ~1 μm, as demonstrated by Stranks et al., Electron-hole diffusion lengths exceeding 1 micrometer in an organometal trihalide perovskite absorber, Science, 2013 Oct. 18; 342(6156):341-4. doi: 10.1126/science.1243982.

In addition to an absorption of visible light and X-ray radiation, a material crystallized in a perovskite lattice layer also exhibits good electrical conductivity of the generated charge carrier pairs and high mobility of e.g. up to 50 $cm^2/Vs$. Thus, for example, a high power conversion efficiency of up to 19.3% can be obtained with a "perovskite" solar cell (solar cell produced via a material mixture crystallizing in the perovskite lattice) (Science. 2014 Aug. 1; 345(6196):542-6. doi: 10.1126/science.1254050. Photovoltaics. Interface engineering of highly efficient perovskite solar cells. Zhou H, Chen Q, Li G, Luo S, Song T B, Duan H S, Hong Z, You J, Liu Y, Yang Y). This efficiency makes perovskites appear an interesting proposition for the detection of high-energy radiation such as gamma and/or X-ray radiation. However, in order to ensure adequate X-ray absorption, for example, large layer thicknesses of e.g. 10 μm up to 1 mm are required.

Doped perovskites and their use in optoelectronic devices are also disclosed in EP 2 942 826 A.

SUMMARY

The inventors have discovered that there exists a demand for a simple production method for detectors, in particular X-ray detectors, by which it is also possible, in particular according to certain embodiment variants, to achieve high concentrations of scintillator in the detector, as well as a demand for precursor substances for such a method. The inventors have discovered that there exists a demand for detectors comprising perovskites which have an increased level of efficiency and a wide dynamic range.

The inventors have discovered that instead of a complex and expensive fabrication process for producing core shell particles, a simple process can be used in which the individual precursor materials are present as particulate powders and these are subsequently mixed together before a compression method such as, for example, soft sintering forms the final detection layer, e.g. an X-ray conversion layer. Thanks to the use of the composition, it is also easier to produce thicker layers of, for example, equal to or greater than 100 μm instead of solution-processed or vapor-deposited layers of corresponding thickness.

The inventors have furthermore discovered that using powders comprising doped perovskites, preferably coupled with a special embodiment of the detection layers and/or layer sequences in a detector, enables an increase in the diffusion length of charge carriers and an improvement in charge carrier mobility to be achieved while simultaneously reducing the recombination. Dark currents can also be reduced and the rectification or reverse bias characteristic of the detector, of a diode for example, can be improved.

According to a first embodiment, the invention relates to a composition comprising at least two powders, wherein the powders are selected from the group consisting of a powder comprising a p-doped perovskite, a powder comprising an n-doped perovskite, and a powder comprising an undoped perovskite, wherein the powders are intermixed, in particular homogeneously intermixed, or are present as separate phases.

A further embodiment of the invention relates to a method for producing a composition comprising at least two powders, wherein the powders are selected from the group consisting of a powder comprising a p-doped perovskite, and a powder comprising an n-doped perovskite, a powder comprising a p-doped perovskite, and a powder comprising an undoped perovskite, wherein the at least two powders are provided, the powders are added to one another, and if necessary the powders are mixed together.

In a further embodiment, the invention also relates to a method for producing a detector, in particular an X-ray detector, comprising providing a substrate comprising a first electrode, depositing a composition according to at least one embodiment of the invention, and depositing a second electrode, wherein the composition according to at least one embodiment of the invention is compressed, in particular via sintering.

In a further embodiment, the invention additionally relates to a detector, in particular an X-ray detector, which is fabricated by way of at least one embodiment of the inventive method for producing a detector.

Further aspects of the present invention may be derived from the dependent claims and the detailed description.

BRIEF DESCRIPTION OF THE DRAWINGS

The accompanying drawings are intended to illustrate embodiments of the present invention and to convey a further understanding of the latter. They serve in connection with the description to explain concepts and principles of the invention. Other embodiments and many of the cited advantages will become apparent with reference to the drawings. The elements of the drawings are not necessarily represented true to scale with respect to one another. Unless stated otherwise, like, functionally identical and like-acting elements, features and components are labeled with the same reference signs in each case in the figures of the drawings.

A further example schematic layer structure of an inventive detector in the form of an X-ray detector comprising sintered perovskite powder is shown in FIG. 7.

Developments from FIG. 8 are to be found in FIGS. 9 and 10, a sintered heterojunction composed of p- and n-type perovskite powder having an undoped/intrinsic powder to provide a variable doping being shown in FIG. 9, and a p-i-n layer structure composed of sintered p-, i- and n-type perovskite powder being shown in FIG. 10.

DETAILED DESCRIPTION OF THE EXAMPLE EMBODIMENTS

In the following, embodiments of the invention are described in detail with reference to the accompanying drawings. It is to be understood that the following description of the embodiments is given only for the purpose of illustration and is not to be taken in a limiting sense. It should be noted that the drawings are to be regarded as being schematic representations only, and elements in the drawings are not necessarily to scale with each other. Rather, the representation of the various elements is chosen such that their function and general purpose become apparent to a person skilled in the art.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Various example embodiments will now be described more fully with reference to the accompanying drawings in which only some example embodiments are shown. Specific structural and functional details disclosed herein are merely representative for purposes of describing example embodiments. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated. The present invention, however, may be embodied in many alternate forms and should not be construed as limited to only the example embodiments set forth herein.

It will be understood that, although the terms first, second, etc. may be used herein to describe various elements, components, regions, layers, and/or sections, these elements, components, regions, layers, and/or sections, should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items. The phrase "at least one of" has the same meaning as "and/or".

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. In contrast, when an element is referred to as being "directly" connected, engaged, interfaced, or coupled to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Also, the term "exemplary" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Before discussing example embodiments in more detail, it is noted that some example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Specific structural and functional details disclosed herein are merely representative for purposes of describing example embodiments of the present invention. This invention may, however, be embodied in many alternate forms and should not be construed as limited to only the embodiments set forth herein.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

Within the context of embodiments of the invention, gamma and X-ray radiation comprise radiation in an energy range of 1 keV to 5 MeV (1.24 nm to 0.25 pm). Both types of radiation represent ionizing radiation, where X-ray radiation has its origin in the electron shells, for example as a result of transitions and deceleration, while gamma radiation is produced as a result of nuclear processes, by decay/fusion, for example. In this case the energy ranges of the two types of radiation may overlap. According to certain embodiment variants, X-ray radiation covers the range from 1 keV to 250 keV (1.24 nm-5 pm). According to certain embodiment variants, X-ray radiation is detected, i.e. a detector for X-ray radiation or, as the case may be, a method for producing the same is disclosed.

Within the context of embodiments of the invention, p-doped perovskite is also referred to as p-type perovskite, n-doped perovskite also as n-type perovskite, and undoped or intrinsic perovskite also as i-type perovskite.

Within the context of embodiments of the invention, the undoped perovskites are present as crystals which are not subject to any particular restrictions and may include materials of the type $ABX_3$ and/or $AB_2X_4$, where A for example represents at least one monovalent, divalent and/or trivalent, positively charged element from the 4th period or above of the periodic table and/or mixtures therefrom, i.e. also comprises the 5th, 6th and 7th period including the lanthanoids and actinoids, where the 4th period of the periodic table begins with K and comprises the transition metals starting from Sc; B represents—for example a monovalent—cation whose volume parameter for the respective element A is sufficient for perovskite lattice formation; and X is selected for example from the anions of halogenides and pseudohalogenides, for example from the anions chloride, bromide and iodide, as well as mixtures of the same.

The undoped as well as the doped perovskites may in this case accumulate as crystals, i.e. perovskite crystals, homogeneously or heterogeneously monocrystalline or polycrystalline, and in the powders of the composition form powders crystallizing in the perovskite lattice. The perovskites, also referred to within the context of the invention as perovskite crystals, may therefore be present in monocrystalline or polycrystalline form. According to certain embodiment variants, the perovskites are homogeneous. Furthermore, the perovskites may also be present as mixed crystals, though preferably no mixed crystals are present.

According to certain embodiment variants, A comprises or is a divalent and/or trivalent element from the 4th period or above of the periodic table. According to certain embodiment variants, in the above formulae A comprises or is Sn, Ba, Pb, Bi or mixtures composed thereof. The perovskites may therefore also include mixtures composed of different elements from the fourth period or above, i.e. for example two different divalent elements or a mixture composed of monovalent and trivalent elements. According to certain embodiment variants, the perovskites comprise only one element from the 4th period or above of the periodic table. Preferably included therein are Sn, Ba and Pb as well as mixtures thereof, in particular divalent cations of said elements.

B represents a monovalent cation whose volume parameter for the respective element A is sufficient for perovskite lattice formation. In this case the corresponding volume parameters for the perovskite lattice formation are sufficiently well-known, both theoretically and from for example X-ray crystallographic studies, as also are the volume parameters of monovalent cations and cations defined under A. Accordingly, the corresponding monovalent cation B can be suitably determined after the elements A and, where applicable, C have been determined, for example with the aid of computer models as well as simple experiments where necessary. In the above formulae, B preferably represents a monovalent, amino group containing, positively charged carbon compound, a carbon compound being a compound having at least one carbon atom and consequently comprising organic as well as inorganic compounds. According to certain embodiment variants, B is selected from the group consisting of amidinium ions, guanidinium ions, isothiuronium ions, formamidinium ions, as well as primary, secondary, tertiary, and/or quaternary organic ammonium ions, which particularly preferably have 1 to 10 carbon atoms, in particular 1 to 4 carbon atoms, where these may involve aliphatic, olefinic, cycloaliphatic and/or aromatic carbon bonds.

X is selected for example from the anions of halogenides and pseudohalogenides and is preferably selected from the anions chloride, bromide and iodide as well as mixtures of the same. Thus, different halogenide ions for example may also be contained in the perovskites, though according to certain embodiment variants only one halogenide ion such as, for example, iodide is included.

Materials of the general formula $ABX_3$ and $AB_2X_4$ can crystallize in particular in the perovskite lattice when A is a divalent element from the 4th period or above in the PTE, B is an arbitrary monovalent cation whose volume parameter for the respective element A is sufficient for perovskite lattice formation, and X corresponds to the halogenide anions iodide, bromide or chloride, or mixtures thereof. Although it is not excluded according to the invention that perovskites of both the general formula $ABX_3$ and the general formula $AB_2X_4$ may be present in the detection layer, it is also possible that only perovskites according to one of the two formulae, for example $ABX_3$, are present.

Examples of suitable candidates as perovskites are the materials mixed in the molar ratio:

$CH_3$—$NH_3I$:$PbI_2$=$PbCH_3NH_3I_3$ $CH_3$—$CH_2$—$NH_3I$:$PbI_2$=$PbCH_3NH_3I_3$

HO—$CH_2$—$CH_2$—$NH_3$:$PbI_2$=PbHO—$CH_2$—$CH_2$—$NH_3I_3$

Ph-$CH_2$—$CH_2$—$NH_3I$:$PbI_2$=Pb(Ph-$CH_2$—$CH_2$—$NH3)_2I_4$

Accordingly, the known material formed from methylammonium iodide and lead (II) iodide ($MAPbI_3$) for example is therefore regarded as an intrinsic or undoped perovskite.

Varying the substitution pattern of the ammonium component enables the formed perovskite to be implemented as more strongly p-conducting via a donor function or more strongly n-conducting via an acceptor function. However, the range of variation is usually relatively small on account of the geometry requirement.

The composition is therefore based also on the production of n- and p-doped perovskite powders, which are not subject to any particular restrictions, and such powders are also shown for example in FIG. 3, which is described in more detail hereinbelow. Undoped perovskite powders are described for example in DE 10 2014 225 543 and DE 10 2014 225 541, the entire content of each of which are hereby incorporated herein by reference, and methods for doping perovskites for example in EP 2 942 826 A, the entire content of which are hereby incorporated herein by reference.

Materials, molecules and methods that enable a doping of perovskites are described for example as follows: salt mixtures that crystallize in a perovskite structure are determined by their molecule geometry. For the application of such materials in detectors, such as X-ray detectors, heavy metal salt mixtures that crystallize in the perovskite lattice are a prerequisite.

Ammonium salts as B—comprising halogenides such as $Cl^-$, $Br^-$, $I^-$—which increase the p-type conduction are e.g. 2-methoxyethyl ammonium halogenide, 4-methoxybenzyl ammonium halogenide, amidinium halogenide, S-methyl thiouronium halogenide, N,N-dimethylhydrazinium halogenide, N,N-diphenylhydrazinium halogenide, phenylhydrazinium halogenide and methylhydrazinium halogenide.

Ammonium salts as B—comprising halogenides such as $Cl^-$, $Br^-$, $I^-$—which increase the n-type conduction are e.g. cyanomethylammonium halogenide, 2-cyanoethylammonium halogenide and 4-cyanobenzylammonium halogenide.

In addition, however, all other donor- or acceptor-functionalized salt structures which fulfill the geometry requirements of perovskites and crystallize with the cations, for example heavy metal ions, in the perovskite crystal structure, are also materials which meet the necessary requirements as n- or p-type perovskites, and consequently are included in the composition according to the invention or in the detectors as well as in the production method thereof.

According to a first embodiment, the invention relates to a composition comprising at least two powders, wherein the powders are selected from the group consisting of a powder comprising a p-doped perovskite, a powder comprising an n-doped perovskite, and a powder comprising an undoped perovskite, wherein the powders are intermixed, in particular homogeneously intermixed, or are present as separate phases. According to certain embodiment variants, individual powders or all of the powders may consist of the respective undoped or doped perovskite. According to certain embodiment variants, the composition consists of perovskite powders only, for example 2, 3, 4, 5, 6 or more perovskite powders.

According to certain embodiment variants, the intrinsic perovskites enable a suitable doping level to be set in a layer that is to be formed in a detector. In the case of adjacent phases in a detector that is to be formed, the p- and n-type perovskites can, according to certain embodiment variants, form a heterojunction through formation of two adjoining layers, and in the case of an intermixing in the detector that is to be formed can, according to certain embodiment variants, form a bulk heterojunction through formation of one layer.

In this case the doped perovskites, i.e. the p- and n-type perovskites, as well as the undoped perovskite, may be derived from the same undoped perovskite material or be derived from different precursor substances.

What is to be understood as separate phases is that the powders have substantially not mixed with one another, in other words, for example, by more than 90, 95 or 99 wt %, referred to the mixture, and preferably have not mixed and/or have mixed in such a way that percolation paths of the two phases are still present, so that charge carrier transport is still possible. In this case a mixture is present, for example, when particles of a powder are in contact with one another not only at a boundary between the powders.

A composition according to an embodiment of the invention can therefore comprise for example a powder of an n-doped and a powder of a p-doped perovskite, a powder of an n-doped and a powder of an undoped perovskite, a powder of a p-doped perovskite and a powder of an undoped perovskite, or a powder of an n-doped perovskite, a powder of a p-doped perovskite and a powder of an undoped perovskite, wherein it is not ruled out that two or more powders of a p-doped, of an n-doped and/or of an undoped perovskite are also included in each case. Given the presence of more than two powders, the different perovskite powders may in this instance be present in a composition according to an embodiment of the invention in each case fully intermixed, partially intermixed and partially separated into phases, or fully separated into phases.

Examples of inventive compositions of embodiments are also cited in relation to the method for producing detectors or may be derived from these analogously. Thus, e.g. in the production of a p-n structure, in other words of a layer having p-doped perovskite and a layer having n-doped perovskite, a composition is necessary where a p-doped perovskite and an n-doped perovskite are present in separate phases, in the case of a hybrid layer containing p- and n-type perovskites, also referred in the following as a perovskite bulk heterojunction (BHJ), a mixture of n-doped and p-doped perovskite is necessary in the composition, and for example in the case of a p-BHJ-n structure a composition is necessary in which three separate phases are present, wherein the first contains p-type perovskite, the second a mixture composed of p- and n-type perovskite, and the third n-type perovskite.

According to certain embodiment variants, the composition according to the invention can be used for producing or in the production of detectors, for example X-ray and/or gamma ray detectors, preferably X-ray detectors, e.g. digital pixelated X-ray detectors. Particularly preferably, X-ray detectors should be cited in which the perovskite layer is applied to a substrate comprising a TFT array (referred to as flat panel detectors). These detectors collect the electrons produced by X-ray radiation in each pixel and are then read out sequentially. These detectors find application in particular in angiography, mammography and radiography. Also particularly preferably, the perovskite layer may be deposited onto a CMOS structure as is often required in computed tomography. In this case the X-ray induced signal is digitized directly in each detector element, thus enabling a high temporal resolution to be achieved.

The perovskites in the powders are not subject to any particular restrictions in terms of their size and shape. According to certain embodiment variants, the powders comprise particles, i.e. perovskite particles, having an average particle size of 0.5 to 200 µm, preferably 0.8 to 100 µm, further preferably 1 to 10 µm.

The diameters of the perovskite particles can in this case be suitably determined, and consequently set, via optical (e.g. dynamic light scattering (DLS)), electron microscopic or electrical analysis methods (e.g. Coulter counter). According to certain embodiment variants, the perovskite particles are present as substantially sphere-shaped, for example spherical particles.

Providing the composition in powder form makes producing detection layers or detectors much easier and more cost-effective in comparison with producing and using core-shell particles.

According to certain embodiment variants, the composition comprises at least one powder comprising a p-doped perovskite and a powder comprising an n-doped perovskite which are mixed with one another. By this means a perovskite BHJ can be formed in a detector.

According to certain embodiment variants, the respective perovskite powders are produced by precipitation and/or are present as particulate powders.

According to certain embodiment variants, as well as the perovskite powders, the composition according to the invention and/or the detection layer of the detector which is formed from the composition may also contain supplementary agents or additives such as diiodoctane, Triton-X (polyethylene glycol), thiols or crosslinkers such as bifunctional or multifunctional oxirane or oxetane derivatives (so-called monomer liquid network formers) in order to improve their electrical and/or mechanical performance, in order, for example, to improve the sensitivity, the charge carrier transport, the reduction in charge carrier recombination, etc. The additives are in this case not subject to any particular restrictions. According to certain embodiment variants, no additives are contained in the composition according to the invention and/or the detection layer which is formed in the detector from said composition.

A further embodiment of the invention relates to a method for producing a composition comprising at least two powders, wherein the powders are selected from the group consisting of a powder comprising a p-doped perovskite, and a powder comprising an n-doped perovskite, a powder comprising a p-doped perovskite, and a powder comprising an undoped perovskite, wherein the at least two powders are provided, the powders are added to one another, and if necessary the powders are mixed together. In particular the composition according to the invention can be produced via this method. According to the invention, the adding together of the powders is in this case not subject to any particular restrictions, though according to certain embodiment variants it may be dependent on the purpose for which it is used, for example in the production of detectors having specific layer sequences and/or compositions, as also described by way of example further below.

Homogeneous monocrystalline or polycrystalline powders crystallizing in the perovskite lattice can be used for example for producing the composition.

The intermixing of the powders, for example of two powders, as it is carried out, is not subject to any particular restrictions. It can take place for example via a contactless mixing method or via mixing methods involving contact, e.g. via speed mixing, vibration, rotation or shaking, ultrasound, etc. According to certain embodiment variants, the precursor powders are intermixed by way of contactless high-speed mixers. By way of the mixing process it is possible, according to certain embodiment variants, to mix any desired proportions of powders, and thus to produce e.g. any desired concentrations of n- and p-type phases in a perovskite BHJ layer of a detector. This enables e.g. unequal diffusion constants of the charge carriers, i.e. of the doped perovskites for example, to be compensated. Weight concentrations of e.g. more than 0:1 up to 1:more than 0, for example a weight concentration of 1:1, referred to a composition for a perovskite BHJ, are conceivable.

In this case the mixing speed is not subject to any particular restrictions and can depend for example on the particle sizes and/or shapes of the individual powders. The intermixing can in this case take place for example at mixing speeds of 10,000 rpm or less, for example 5000 rpm or less, for example 3000 rpm or less.

Prior to the intermixing, the powder comprising a p-doped perovskite and/or the powder comprising an n-doped perovskite and/or the powder comprising undoped perovskite can, according to certain embodiment variants, be cooled in an inert gas to a temperature of 10° C. or lower, e.g. between 5 and −20° C., for example 0° C. or lower, for example −10° C. or lower. Mixing at room temperature (~20-25° C.) is, however, equally possible according to certain embodiment variants.

According to certain embodiment variants, the powders are mixed together, and the intermixing is performed for a time period of less than 600 s, preferably less than 300 s, further preferably less than 180 s. Depending on the particular powders, periods lasting from a few seconds to minutes can achieve an optimal intermixing, for example.

Figure 3:
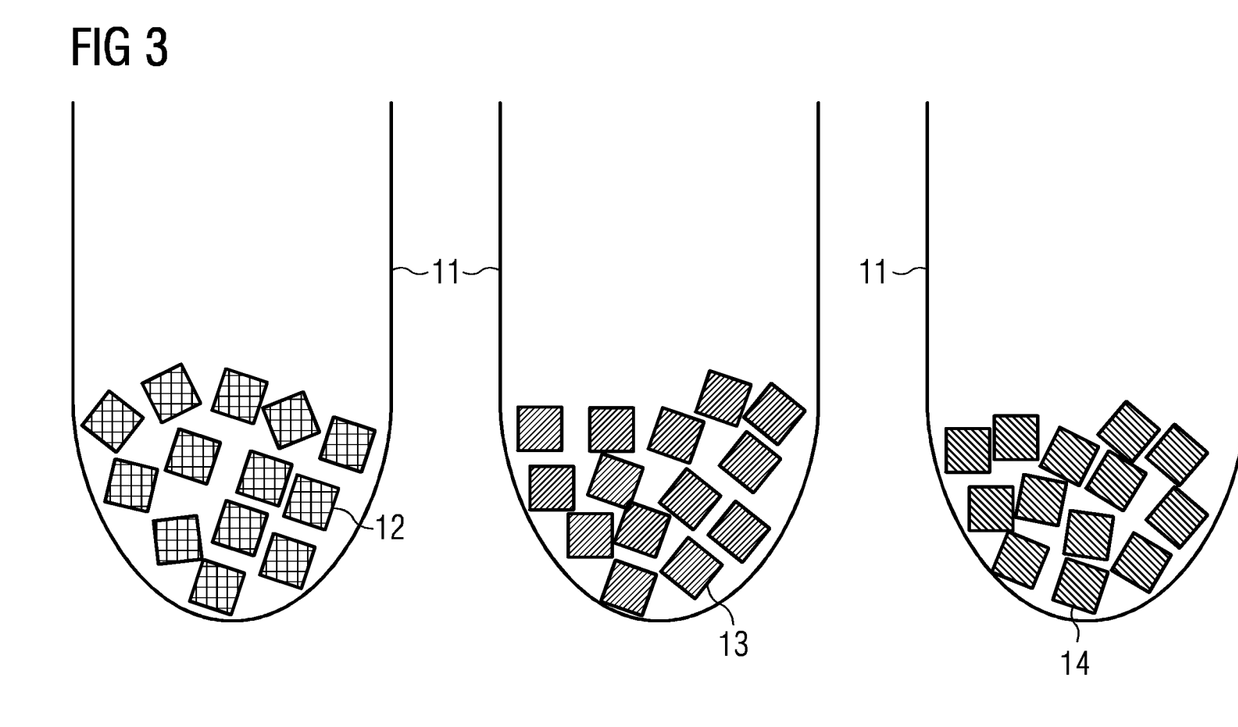
FIG. 3 schematically shows examples of precursor materials for an inventive powder mixture in the form of a p-doped, n-doped and undoped/intrinsic perovskite powder, respectively.
Figure 4:
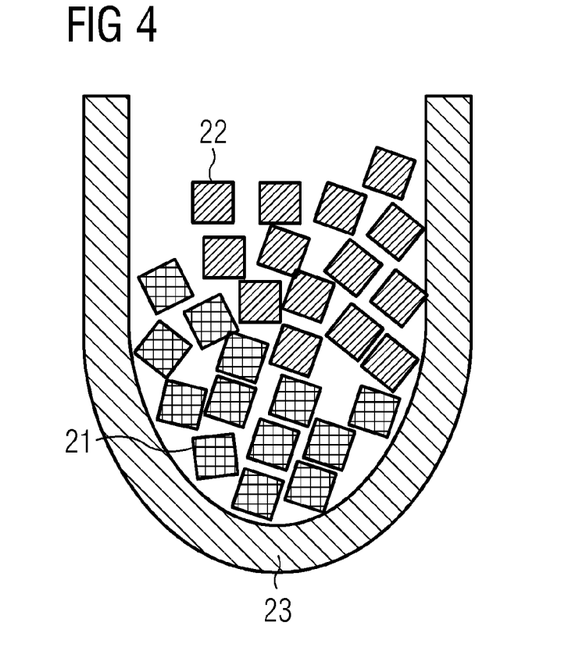
FIGS. 4 and 5 schematically show by way of example a mixing of the precursor materials, in this case two thereof, from FIG. 3, the state prior to the intermixing being shown in FIG. 4 and the state after the intermixing, for example by way of speed mixing, being shown in FIG. 5.
Figure 5:
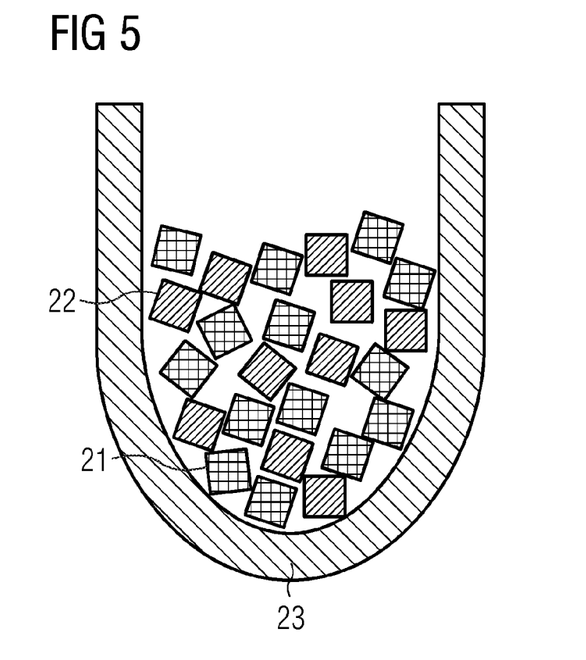

An example intermixing process is shown schematically in FIGS. 3 to 5.

FIG. 3 shows by way of example three possible precursor materials which are provided in separate vessels 11: The first powder consists of a p-doped perovskite powder 12, the second of an n-doped perovskite powder 13, and the third of an intrinsic perovskite powder 14.

In FIG. 4, two of the precursor powders, in this case the p-doped perovskite powder 21 and the n-doped perovskite powder 22, are introduced into a mixer vessel 23, wherein the powders are in this case designated as p-doped perovskite powder 21 and n-doped perovskite powder 22 in order to differentiate them from the separate powders in FIG. 3. FIG. 4 in this instance represents the state prior to an intermixing. After the intermixing, a homogeneous distribution of the two powders is achieved, as shown in FIG. 5.

In a further embodiment, the invention furthermore relates to a method for producing a detector, in particular an X-ray detector, comprising:

Providing a substrate comprising a first electrode;
depositing a composition according to the invention; and
depositing a second electrode;
wherein the composition according to an embodiment of the invention is compressed, in particular via sintering, e.g. soft sintering. Such a method is suitable for example for producing flatbed detectors.

By depositing compositions having a plurality of separate phases and/or by depositing a plurality of compositions and/or by depositing powders comprising or consisting of only i-type perovskite, n-type perovskite or p-type perovskite, it is possible in this case also to form intermediate layers that may be located adjacent to a detection layer, etc. Example layer sequences which can be formed in this way are described hereinbelow, though they do not limit the method and the detector to said layer sequences, but rather any other desired layer sequences may also be produced.

Different routes can be followed in this case in order to produce the detectors having the compressed composition:

1) The composition or a plurality of compositions, where appropriate containing further powders, is or are gradually compressed onto one another, for example via soft sintering.

2) Individual self-supporting layers are compressed from the composition or compositions and where appropriate further powders and then are deposited onto the substrate and pressed together.

3) Hybrid forms of 1) and 2) are also conceivable.

An embodiment of an inventive method for producing a detector may also comprise the following steps:

Compressing a composition according to an embodiment of the invention, in particular via sintering, in order to form a compressed layer;
depositing a first electrode and where necessary a substrate on a first side of the compressed layer; and
depositing a second electrode on a side opposite the first side of the compressed layer. A detector produced in this way can find application in computed tomography, for example.

During the compression of the composition there can be produced in the detector a detection layer in which radiation such as, for example, gamma and/or X-ray radiation, preferably X-ray radiation, can then be detected. The detector produced via this method is therefore, for example, a gamma ray detector and/or an X-ray detector, in particular an X-ray detector.

The substrate comprising the first electrode and the second electrode is subject to no particular restrictions and can be suitably deployed according to detector layer, i.e. dependent on the composition and where appropriate further powders, and also dependent on the radiation that is to be detected, e.g. gamma and/or X-ray radiation. The first electrode itself, for example, may also serve as a substrate.

The substrate may in this case comprise for example a conventional substrate used in detectors, but may also be a temporary substrate from which the detector is also removed again. Thus, for example, glass and/or plastics are suitable as substrates. A substrate may also comprise a functional layer or possess a functional design. Thus, for example, thin film transistors may also serve as a substrate, or arrays (matrices) of thin film transistors (TFT), also known as backplanes. This enables a pixelation of a detector such as an X-ray detector. Backplane TFTs are generally based in this case on a-Si, IGZO and other metal oxides or silicon as a CMOS circuit and are not subject to any particular restrictions. A structured contact for example can then be deposited in each case onto the individual TFTs. A, for example structured, electrode can also be applied directly to a detector layer, e.g. hybrid layer, or an intermediate layer and these can then be attached by way of bonding techniques, such as are known for example from chip-on-glass, chip-on-foil (bumps). According to certain embodiment variants, the substrate, e.g. a backplane, comprises or contains the first, e.g. bottom, electrode.

The electrodes may comprise such materials as are conventionally employed in electronic components, in particular detectors. Suitable electrode materials may include for example metals, e.g. Au, Ag, Pt, Cu, Al, Cr, Mo, etc., or mixtures or alloys thereof, preferably Al, Mo, and Cr, or conductive oxides or metal oxides, e.g. ITO, AZO, preferably ITO, and/or conductive polymers, e.g. PEDOT or PEDOT:PSS. According to certain embodiment variants, the first electrode or the first contact is structured, in order for example to define individual pixel or detector units, and/or the second electrode or the second contact is deposited so as to cover a large area in order, according to certain embodiment variants, to be used in conjunction with a structured first contact as a common contact for all of the pixels. According to certain embodiment variants, the first electrode is connected to a readout electronics circuit, e.g. via ball bonding.

In order to produce an imaging X-ray detector, it is therefore possible for example to deposit the perovskite layer (unstructured) onto an array (matrix) of thin film transistors (TFT), also known as a backplane. In this arrangement, each array element may also be provided with a first electrode which establishes the connection to the perovskite layer. This enables a pixelation of the X-ray detector. Backplane TFTs are generally based on a-Si, IGZO and other metal oxides or silicon as a CMOS circuit.

In order to build a detector for computed tomography, for example, the perovskite layer may also be deposited onto a silicon substrate having integrated CMOS circuits. According to certain embodiment variants, however, a freestanding layer made of perovskite may preferably be compressed initially in this case. The first and second contact for example can then be vapor-deposited onto the layer. According to certain embodiment variants, the first contact is in this case preferably structured and the second provides large area coverage. Subsequently, the detector can then for example be bonded onto a readout electronics circuit, e.g. via ball bonding.

By way of an embodiment of the inventive method for producing a detector it is also possible, according to certain embodiment variants, to fabricate thicker absorber layers, for example having thicknesses of 0.5 to 1000 µm, e.g. 10 to 500 µm or 50 to 200 µm from monocrystalline or polycrystalline perovskite powders via a cost-effective method such as soft sintering, for example.

According to certain embodiment variants, a sintering process, for example a soft sintering process, is carried out at a temperature between 30 and 300° C., preferably between 50 and 200° C., further preferably between 100 and 200° C., e.g. between 100 and 150° C., in order to achieve the compression. The temperature range of the sintering can in this case be dependent on the choice of perovskites and, where applicable, of the additives used, the method used to produce the precursor powders, etc.

The pressures applied during the soft sintering process are so high, for example between 3 and 500 MPa, that the particles of the perovskite powders are compressed to such a degree that compacting occurs. According to certain embodiment variants, the compression is brought about by carrying out a sintering process at a pressure between 3 and 500 MPa, preferably between 4 and 200 MPa, further preferably between 5 and 100 MPa, particularly preferably between 5 and 50 MPa. As a result of the high pressures, the particles of the perovskites can suitably "flow into one another" or be suitably compressed.

As a result of compressing the composition by way of pressure and, where applicable, temperature, for example via a sintering process, the interstices in the detection layer—and where applicable further layers—are minimized and compressed in such a way that electrical charge transport, e.g. by way of hopping or redox processes between the individual molecules of the powders, becomes possible when an electrical voltage is applied.

The fabrication of the perovskite layers, that is to say of layers which are produced from a composition according to the invention or from perovskite powders, for example therefore of a perovskite BHJ, in the detectors, e.g. X-ray detectors, is accomplished, according to certain embodiment variants, via sintering, for example via "soft sintering", from the dry phase. Such a method is known for example from DE 10 2014 225541, the entire contents of which are hereby incorporated herein by reference, to which reference is herewith made in respect of the sintering. According to certain embodiment variants, the sintering is carried out substantially without solvents, i.e. for example with less than 5, 1, 0.5 or 0.1 wt %, referred to the composition, preferably without solvents.

According to certain embodiment variants, the composition comprises at least a powder comprising a p-doped perovskite and a powder comprising an n-doped perovskite, which are thoroughly mixed with one another, wherein the compression results in the formation of a first layer in the form of a BHJ in which the p-doped perovskite and the n-doped perovskite are present in a mix. By this means, a perovskite BHJ can be formed in a detector following the compression.

Through the use of at least two powder materials having different doping and the fabrication of a BHJ perovskite layer, it is possible to arrange the transport of the different charge carrier types in a spatially separated manner, which can reduce losses due to recombination.

According to certain embodiment variants, if a perovskite BHJ layer is present, a second layer comprising p-doped perovskite as bottom layer and/or a third layer comprising n-doped perovskite as top layer can be formed in addition, which layers are in each case introduced between the first layer and the first electrode and/or the second electrode, as is apparent by way of example also in FIGS. 6 and 7, which are explained in detail later. Thus, only a second layer may be introduced between the first or BHJ layer and the first electrode, only a third layer may be introduced between the first or BHJ layer and the second electrode, or both layers may be introduced accordingly. If both layers are introduced, a p-BHJ-n structure can therefore be formed in the detector.

The production of p-BHJ-n perovskite structures, wherein the p-doped and/or n-doped perovskites in the BHJ may or may not correspond to those of the adjacent layers, though preferably do correspond, enables a reduction in the leakage current (analogously to p-i-n silicon photodiodes) and consequently a greater dynamic range of the X-ray detector. The diffusion constant of the charge carriers can also be selectively increased by this means through selection of corresponding p-doped and n-doped perovskites, as a result of which mobilities of the two charge carriers can be selectively increased in the respective doped phase. By introducing i-type perovskite into a perovskite BHJ layer it is furthermore possible to form a depletion zone as in the case of Si-based detectors.

According to certain embodiment variants, undoped perovskite is introduced into the first BHJ layer and/or the second or bottom layer and/or the third or top layer. Undoped perovskite may therefore be contained in the first layer or in the second layer or in the third layer alone, in the first and second layer, in the first and third layer, or in the second and third layer, or in the first, second and third layer. The doping level of the layers can be varied by addition of intrinsic perovskite.

According to certain embodiment variants, the at least two powders are present as separate phases, therefore form no BHJ, but rather, for example in the case of p- and n-doped powder, a heterojunction.

According to certain embodiment variants, the composition comprises at least a powder comprising a p-doped perovskite and a powder comprising an n-doped perovskite, wherein the p-doped perovskite and the n-doped perovskite are present separately in a first layer of a heterolayer structure, i.e. without BHJ, comprising p-doped perovskite and a second layer of a heterolayer structure comprising n-doped perovskite. If the two powders or the two layers are adjacent to one another, a p-n structure therefore forms in the detector.

According to certain embodiment variants, a third layer comprising undoped perovskite or consisting thereof is introduced between the first layer and second layer of such a hetero layer structure. By this means, a p-i-n structure can be realized in the detector, as is shown for example in FIG. 10, which will be explained in detail later. If a layer consisting of undoped perovskite is introduced between the heterojunction, this should, according to certain embodiment variants, be as thin as possible in order to enable a charge carrier transport, having for example a thickness of max. 500 μm, preferably max. 200 μm, further preferably max. 100 μm.

According to certain embodiment variants, a third layer comprising p-doped perovskite and undoped perovskite is introduced adjacent to the first layer of such a heterolayer structure and/or a fourth layer comprising n-doped perovskite and undoped perovskite is introduced adjacent to the second layer of such a heterolayer structure. It is therefore possible for only one of the third and the fourth layer to be introduced, which can lead to a layer sequence first layer, third layer, second layer; third layer, first layer, second layer, etc. According to certain embodiment variants, a sequence first layer, third layer, fourth layer, second layer is produced in a heterolayer structure, as is shown for example in FIG. 9, which will be explained in detail later.

In a further aspect, an embodiment of the invention relates to a detector, in particular an X-ray detector, which is produced via the inventive method for producing a detector.

According to certain embodiment variants, the detector accordingly comprises a substrate having a first electrode, one or more layers comprising or consisting of perovskite, for example also in a mix, which has or have been produced from the composition according to an embodiment of the invention, and a second electrode. Corresponding layer structures may be derived for example from the above embodiment variants relating to the method for producing the detectors.

The above embodiment variants, embodiments and developments may be combined with one another in any desired manner insofar as this is beneficial. Further possible embodiments, developments and implementations of the invention also encompass not explicitly cited combinations of features of the invention described hereintofore or hereinafter in relation to the example embodiments. In particular, the person skilled in the art will also add individual aspects as improvements or extensions to the respective basic form of embodiments of the present invention.

Figure 6:
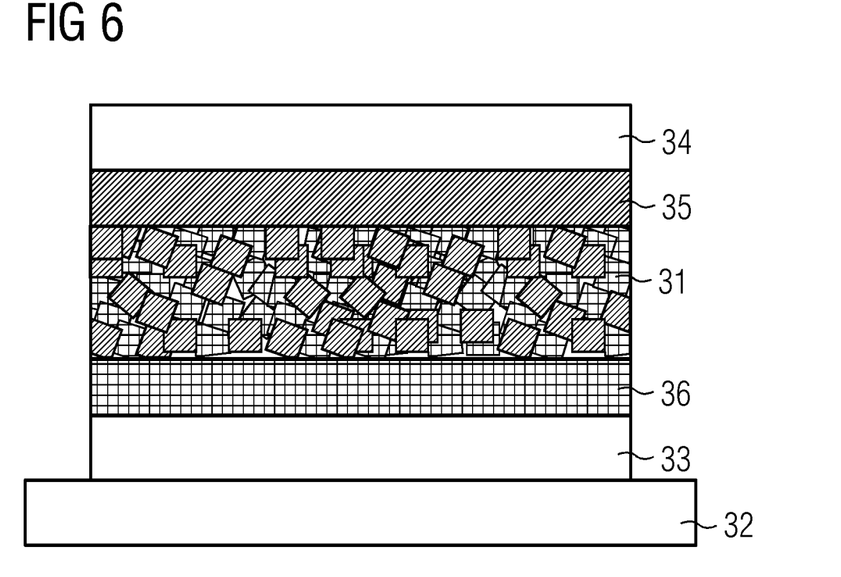
FIG. 6 schematically shows an example layer structure of a detector according to an embodiment of the invention in the form of an X-ray detector comprising a sintered perovskite powder.
Figure 7:
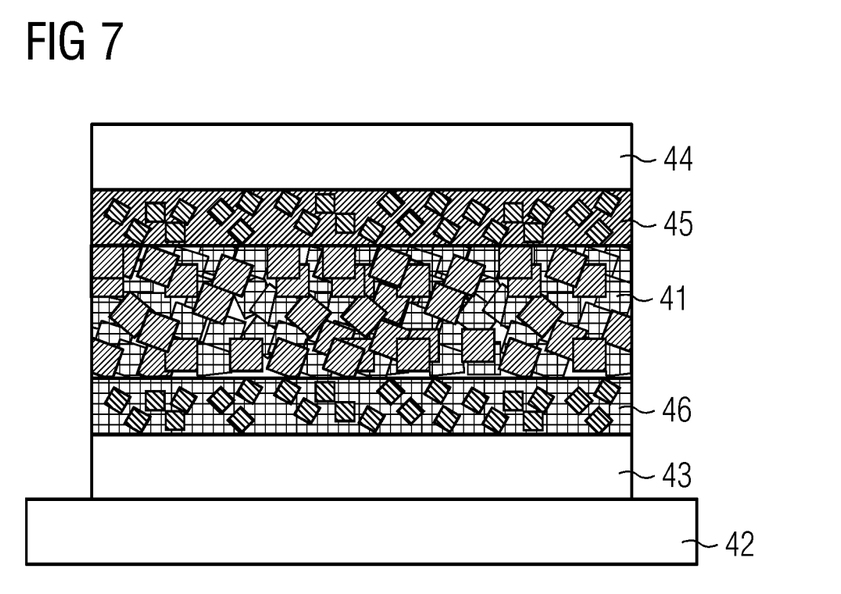

Example embodiment variants of detectors according to the invention, in particular X-ray detectors, are explained below with reference to schematic figures:

FIG. 6 shows the layer structure of an example X-ray detector after a soft sintering process in the configuration p-BHJ-n. Following the soft sintering process, the different perovskite layers are fully compacted and therefore contain no pockets of entrapped air. For a complete component, the p-BHJ-n perovskite layers are deposited between two electrodes onto a substrate.

This results in the following layer structure:
32 substrate
33 first electrode as bottom electrode
36 second layer comprising p-type perovskite, wherein a perovskite layer is produced from p-doped particles in a compressed (sintered) layer after the sintering process
31 first layer comprising a perovskite BHJ in which p-type perovskite and n-type perovskite are mixed with one another, wherein after the sintering process a mixture of n- and p-doped perovskites in a compressed (sintered) layer results
35 third layer comprising n-type perovskite, wherein a perovskite layer composed of n-doped particles in a compressed (sintered) layer results after the sintering process
34 second electrode as top electrode In the structure shown in FIG. 7, which is based on the structure in FIG. 6, it is further illustrated how it is possible to vary the doping level of the n- or p-type perovskite layer by admixing intrinsic perovskite to the p- and n-type perovskites prior to the soft sintering process.

Figure 8:
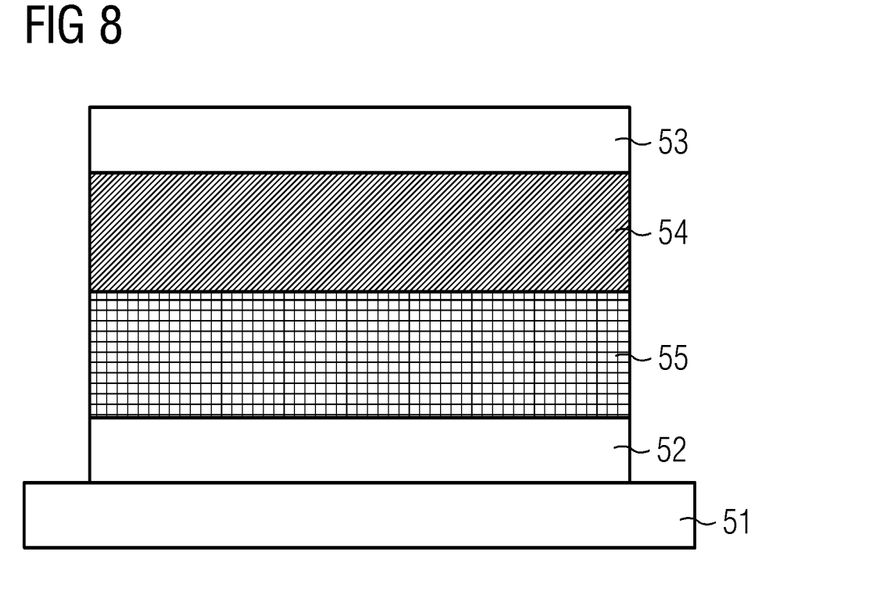
FIG. 8 schematically shows yet another layer structure of an embodiment of an inventive detector in the form of an X-ray detector comprising a sintered heterojunction composed of p- and n-type perovskite powder.

This results in the following layer structure:
42 substrate
43 first electrode as bottom electrode
46 second layer comprising p-type perovskite and i-type perovskite, wherein a perovskite layer composed of intrinsic and p-doped particles in a compressed (sintered) layer is produced after the sintering process
41 first layer comprising a perovskite BHJ, in which p-type perovskite and n-type perovskite are mixed with one another, wherein after the sintering process a mixture of n- and p-doped perovskites in a compressed (sintered) layer results
45 third layer comprising n-type perovskite and i-type perovskite, wherein a perovskite layer composed of intrinsic and n-doped particles in a compressed (sintered) layer results after the sintering process
44 second electrode as top electrode FIG. 8 schematically shows a further embodiment of a layer structure in a detector according to the invention, for example an X-ray detector. In said structure, a sintered heterojunction composed of p- and n-type perovskite powder is formed—analogously to p-n diodes made of silicon—, though in this case no formation of a perovskite BHJ takes place.

Figure 9:
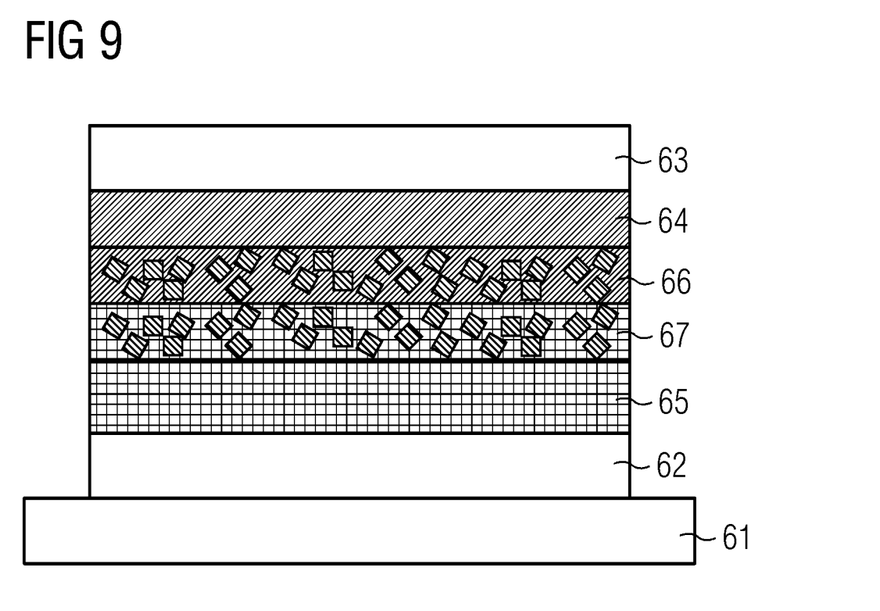

In this configuration, the layer structure is as follows:
51 substrate
52 first electrode as bottom electrode
55 first layer comprising p-type perovskite, wherein a perovskite layer composed of p-doped particles in a compressed (sintered) layer is produced after the sintering process
54 second layer comprising n-type perovskite, wherein a perovskite layer composed of n-doped particles in a compressed (sintered) layer is produced after the sintering process
53 second electrode as top electrode FIG. 9 represents an extension of the concept of the layer structure depicted in FIG. 8. FIG. 8 schematically shows a sintered heterojunction composed of p- and n-type perovskite powder with a proportion of intrinsic perovskite to provide a variable doping, which is mixed in in the transition zone of said layers. This is to be regarded in this case analogously to p-i-n diodes made of silicon.

Figure 10:
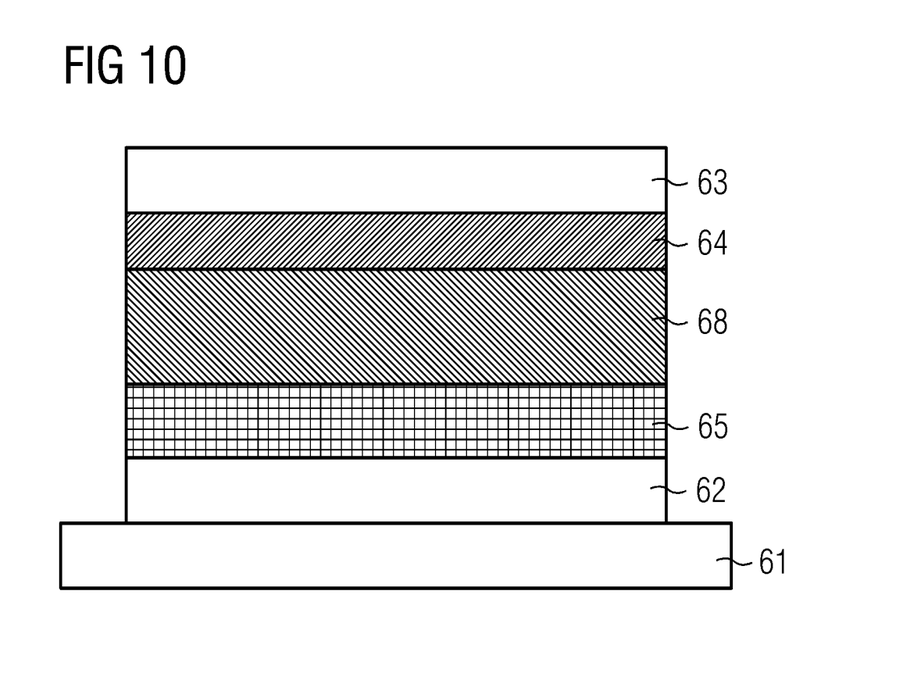

The following layer structure is produced:
61 substrate
62 first electrode as bottom electrode
65 first layer comprising p-type perovskite, wherein a perovskite layer composed of p-doped particles in a compressed (sintered) layer is produced after the sintering process
67 third layer comprising p-type perovskite and i-type perovskite, wherein a perovskite layer composed of intrinsic or undoped and p-doped particles in a compressed (sintered)
66 layer is produced after the sintering process fourth layer comprising n-type perovskite and i-type perovskite, wherein a perovskite layer composed of intrinsic or undoped and n-doped particles in a compressed (sintered) layer is produced after the sintering process
64 second layer comprising n-type perovskite, wherein a perovskite layer composed of n-doped particles in a compressed (sintered) layer is produced after the sintering process
63 second electrode as top electrode An extension of the embodiment variant in FIG. 8 can also be seen in FIG. 10. This schematically shows a layer structure in a detector, for example an X-ray detector, having a sintered heterojunction composed of p- and n-type perovskite powder and an intrinsic layer for forming a p-i-n structure.

The layer structure is as follows:
61 substrate
62 first electrode as bottom electrode
65 first layer comprising p-type perovskite, wherein a perovskite layer composed of p-doped particles in a compressed (sintered) layer is produced after the sintering process
68 third layer comprising i-type perovskite, wherein a perovskite layer composed of intrinsic or undoped particles in a compressed (sintered) layer is produced after the sintering process
64 second layer comprising n-type perovskite, wherein a perovskite layer composed of n-doped particles in a compressed (sintered) layer is produced after the sintering process
63 second electrode as top electrode By providing powder-based compositions comprising perovskite it is possible in a simple manner to provide effective detection structures, where necessary also having interlayers, for detectors, in particular X-ray detectors, wherein said detectors are easy to produce. All three perovskite powders (p-doped, n-doped or undoped/intrinsic) are in this case suitable for example for use in detectors, in particular X-ray detectors, that are based on direct conversion, and allow the production of thicker absorber layers, for example of 0.5 µm to 1000 µm, composed for example of monocrystalline and/or polycrystalline perovskite powders via a cost-effective method such as soft sintering. At the same time the conversion rate of the absorber layer can be increased as a result of the direct absorption of the X-ray radiation, and increased even further as a result of a reduced recombination rate on account of separate transport phases in a perovskite BHJ.

Through the use of doped perovskites it is furthermore possible to produce a multiplicity of detector structures affording different advantages. Thus, for example, it can be made possible to produce a perovskite bulk heterojunction (BHJ) via soft sintering, in particular by different doping of two or more perovskite powders. This enables the transport of different charge carrier types in the detector to be spatially separated, thereby reducing losses due to recombination. Producing p-BHJ-n perovskite structures furthermore enables the leakage current to be reduced and consequently a greater dynamic range of the X-ray detector to be realized.

The patent claims of the application are formulation proposals without prejudice for obtaining more extensive patent protection. The applicant reserves the right to claim even further combinations of features previously disclosed only in the description and/or drawings.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

None of the elements recited in the claims are intended to be a means-plus-function element within the meaning of 35 U.S.C. § 112(f) unless an element is expressly recited using the phrase "means for" or, in the case of a method claim, using the phrases "operation for" or "step for."

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

LIST OF REFERENCE SIGNS

1 X-ray quantum
2 semiconductor or scintillator for detection
2a, 2b electron-hole pair
2' radiation emitted at lower energy
3 photodetector
4 electrode
11 vessel
12 p-doped perovskite powder
13 n-doped perovskite powder
14 intrinsic perovskite powder
21 p-doped perovskite powder
22 n-doped perovskite powder
23 mixer vessel
31 first layer comprising a perovskite BHJ in which p-type perovskite and n-type perovskite are mixed with one another
32 substrate
33 first electrode
34 second electrode
35 third layer comprising n-type perovskite
36 second layer comprising p-type perovskite
41 first layer comprising a perovskite BHJ
42 substrate
43 first electrode
44 second electrode
45 third layer comprising n-type perovskite and i-type perovskite
46 second layer comprising p-type perovskite and i-type perovskite
51 substrate
52 first electrode
53 second electrode
54 second layer comprising n-type perovskite
65 first layer comprising p-type perovskite
61 substrate
62 first electrode
63 second electrode
64 second layer comprising n-type perovskite
65 first layer comprising p-type perovskite
66 fourth layer comprising n-type perovskite and i-type perovskite
67 third layer comprising p-type perovskite and i-type perovskite
68 third layer comprising i-type perovskite

What is claimed is:

1. A composition comprising at least two powders, wherein the powders are selected from the group consisting of a powder comprising a p-doped perovskite, a powder comprising an n-doped perovskite, and a powder comprising an undoped perovskite, wherein the at least two powders are intermixed or are present as separate phases, and wherein the p-doped and the n-doped perovskite is a material selected from the group of $ABX_3$ and $AB_2X_4$, where A is a positively charged element from the 4th period or above of the periodic table and/or mixtures therefrom, B is a monovalent cation whose volume parameter for the respective element A is sufficient for perovskite lattice formation, and X is an anion of chloride, bromide or iodide.

2. The composition of claim 1, wherein the powders have particles with an average particle size of 0.5 to 200 µm.

3. The composition of claim 2, wherein the powders have particles with an average particle size of 0.8 to 100 µm.

4. The composition of claim 3, wherein the powders have particles with an average particle size of 1 to 10 µm.

5. The composition of claim 2, wherein the composition comprises at least a powder comprising the p-doped perovskite and a powder comprising the n-doped perovskite which are thoroughly mixed with one another.

6. The composition of claim 1, wherein the powder comprising the p-doped perovskite and a powder comprising the n-doped perovskite which are thoroughly mixed with one another.

7. A method for producing a detector, comprising:
providing a substrate comprising a first electrode;
depositing the composition of claim 1, wherein the composition of claim 1 is compressed to form a compressed layer;
depositing the first electrode and where appropriate, a substrate on a first side of the compressed layer; and
depositing a second electrode on a side opposite the first side of the compressed layer.

8. The method of claim 7, wherein the composition comprises at least a powder comprising the p-doped perovskite and a powder comprising the n-doped perovskite, thoroughly mixed with one another, wherein the compression results in the formation of a first layer in which the p-doped perovskite and the n-doped perovskite are present in a mix.

9. The method of claim 8, wherein in addition, at least one of a second layer comprising the p-doped perovskite and a third layer comprising the n-doped perovskite is formed, the at least one second layer being introduced between the first layer and at least one of the first electrode and the second electrode.

10. The method of claim 9, wherein the undoped perovskite is introduced into at least one of the first layer, the second layer and the third layer.

11. The method of claim 8, wherein the undoped perovskite is introduced into at least one of the first layer, the second layer and the third layer.

12. The method of claim 7, wherein the at least two powders are present as separate phases.

13. The method of claim 12, wherein the composition comprises at least a powder comprising the p-doped perovskite and a powder comprising the n-doped perovskite, wherein the p-doped perovskite and the n-doped perovskite are present separately in a first layer comprising p-doped perovskite and a second layer comprising n-doped perovskite.

14. The method of claim 13, wherein a third layer, which comprises the undoped perovskite, is introduced between the first layer and second layer.

15. The method of claim 13, wherein in addition a third layer comprising the p-doped perovskite and the undoped perovskite is introduced adjacent to at least one of the first layer and a fourth layer comprising the n-doped perovskite and the undoped perovskite is introduced adjacent to the second layer.

16. A detector, produced according to the method of claim 7.

17. The composition of claim 1, wherein the powders are homogeneously intermixed, or are present as separate phases.

18. A method for producing a composition comprising at least two powders, the powders being selected from the group consisting of a powder comprising a p-doped perovskite, and a powder comprising an n-doped perovskite, a powder comprising a p-doped perovskite, and a powder comprising an undoped perovskite, wherein the p-doped and the n-doped perovskite is a material selected from the group of $ABX_3$ and $AB_2X_4$, where A is a positively charged element from the 4th period or above of the periodic table and/or mixtures therefrom, B is a monovalent cation whose volume parameter for the respective element A is sufficient for perovskite lattice formation, and X is an anion of chloride, bromide or iodide, the method comprising:
providing the at least two powders;
adding the at least two powders to one another; and
mixing the at least two powders together, if necessary.

19. The method of claim 18, further comprising:
cooling prior to the intermixing, at least one of the powder comprising a p-doped perovskite, the powder comprising an n-doped perovskite, and the powder comprising undoped perovskite, the cooling being done in an inert gas to a temperature of 10° C. or less.

20. The method of claim 19, wherein the powders are mixed and the intermixing is performed for a time period of less than 600 s.

21. The method of claim 18, wherein the powders are mixed and the intermixing is performed for a time period of less than 600 s.

22. The method of claim 18, wherein the powders are mixed and the intermixing is performed for a time period of less than 300 s.

23. The method of claim 22, wherein the powders are mixed and the intermixing is performed for a time period of less than 180 s.

* * * * *